United States Patent
D'Abreu et al.

(10) Patent No.: US 9,153,331 B2
(45) Date of Patent: Oct. 6, 2015

(54) TRACKING CELL ERASE COUNTS OF NON-VOLATILE MEMORY

(71) Applicant: SANDISK TECHNOLOGIES INC., Plano, TX (US)

(72) Inventors: Manuel Antonio D'Abreu, El Dorado Hills, CA (US); Dimitris Pantelakis, Santa Clara, CA (US); Stephen Skala, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 246 days.

(21) Appl. No.: 13/800,637

(22) Filed: Mar. 13, 2013

(65) Prior Publication Data
US 2014/0269069 A1    Sep. 18, 2014

(51) Int. Cl.
G11C 16/16  (2006.01)
G11C 16/06  (2006.01)
G11C 16/34  (2006.01)

(52) U.S. Cl.
CPC ............... *G11C 16/16* (2013.01); *G11C 16/06* (2013.01); *G11C 16/3495* (2013.01)

(58) Field of Classification Search
CPC ............... G11C 16/16; G11C 11/5635; G11C 16/0483; G11C 16/10; G11C 16/3409; G11C 16/345; G11C 16/3472; G11C 2211/5621; G11C 16/225; G11C 16/08; G11C 16/3481

See application file for complete search history.

(56) References Cited

U.S. PATENT DOCUMENTS

| | | | | |
|---|---|---|---|---|
| 7,245,556 | B1 * | 7/2007 | Pinto et al. | 365/236 |
| 7,451,264 | B2 * | 11/2008 | Yero | 711/103 |
| 7,653,778 | B2 * | 1/2010 | Merry et al. | 711/103 |
| 7,864,579 | B2 * | 1/2011 | Gutsche et al. | 365/185.09 |
| 8,874,993 | B2 * | 10/2014 | Eleftheriou et al. | 714/763 |
| 2006/0039196 | A1 * | 2/2006 | Gorobets et al. | 365/185.01 |
| 2006/0149896 | A1 * | 7/2006 | Chang et al. | 711/103 |
| 2006/0161728 | A1 * | 7/2006 | Bennett et al. | 711/103 |
| 2008/0198651 | A1 * | 8/2008 | Kim | 365/185.03 |
| 2010/0162079 | A1 * | 6/2010 | Hwang | 714/758 |
| 2010/0306580 | A1 | 12/2010 | McKean et al. | |
| 2011/0051521 | A1 | 3/2011 | Levy et al. | |
| 2011/0131367 | A1 | 6/2011 | Park et al. | |
| 2011/0131368 | A1 | 6/2011 | Lee et al. | |
| 2012/0243329 | A1 * | 9/2012 | Nagashima | 365/185.22 |
| 2013/0073786 | A1 * | 3/2013 | Belgal et al. | 711/103 |
| 2014/0040681 | A1 * | 2/2014 | Wolfman et al. | 714/704 |

FOREIGN PATENT DOCUMENTS

| | | |
|---|---|---|
| WO | 2010097065 A1 | 9/2010 |
| WO | 2012001556 A1 | 1/2012 |
| WO | 2012089333 A1 | 7/2012 |

* cited by examiner

Primary Examiner — Hien Nguyen
(74) Attorney, Agent, or Firm — Toler Law Group, PC (57) ABSTRACT

A data storage device includes a memory and a controller and may perform a method that includes updating, in a controller of the data storage device, a value of a particular write/erase (W/E) counter of a set of counters in response to an erase operation to a particular region of the non-volatile memory that is tracked by the particular W/E counter and that includes a storage element that is tracked by a particular cell erase counter of the set of counters. The method includes, in response to the value of the particular W/E counter indicating that a count of erase operations to the particular region satisfies a first threshold, initiating a remedial action to the particular region of the non-volatile memory at least partially based on the value of the particular cell erase counter.

22 Claims, 4 Drawing Sheets

TRACKING CELL ERASE COUNTS OF NON-VOLATILE MEMORY

FIELD OF THE DISCLOSURE

The present disclosure is generally related to tracking write/erase cycles of non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

One source of errors that occur in data stored in a memory device is a result of repeated write/erase (W/E) cycles to the memory device. Cell threshold voltage distributions (CVDs) may shift and broaden with increasing numbers of W/E cycles, resulting in an increasing number of data errors as the memory device ages. Wear leveling techniques may be used to distribute W/E operations so that all regions of the memory are subjected to approximately an equal number of W/E cycles. As a result, wear leveling may extend a useful life of the memory device that may otherwise be limited by a portion of the memory that experiences accelerated wearing due to more frequent erase operations as compared to other portions of the memory.

Erasing a block of flash memory conventionally includes applying an erase voltage to the erase block, removing the erase voltage, and reading the storage elements of the block. Erasing a cell conventionally is performed by removing charge from an insulated floating gate of a transistor. As charge is repeatedly applied to the floating gate through via the insulting material (to program data into the cell) and later removed from the floating gate via the insulating material (to erase the data from the cell), programming and erase performance of the transistor may degrade due to changes in the electrical properties of the insulating material. Storage elements that experience a relatively large number of cell erases (e.g., cells that are repeatedly programmed to store a "0" value and then erased) experience more wear than storage elements that have experienced a relatively small number of cell erases (e.g., cells that frequently remain in the erase state to store a "1" value), over an equal number of W/E cycles.

SUMMARY

Erase operations to regions of a non-volatile memory of a data storage device are tracked by a controller of the data storage device. Counts of erases of individual storage elements in the individual regions are also tracked. When a number of erase operations to a particular region satisfies a threshold amount, a remedial action is initiated to the particular region at least partially based on the corresponding counts of cell erases. For example, an erase block in the particular region may be scheduled for non-use based on one or more storage elements in the particular region having a relatively high count of cell erases or may be flagged for enhanced reliability techniques, such as data-parity interleaving or adaptive reading based on the one or more storage elements having a relatively low count of cell erases. Logically partitioning the non-volatile memory into multiple regions enables tracking of W/E cycles of distinct groups of storage elements. The storage elements may be grouped according to anticipated susceptibility to accumulated effects of W/E cycles due to different physical characteristics of the storage elements. By implementing remedial action based on each group's exposure to W/E cycles and based on one or more counts of cell erases, a useful life of the data storage device may be extended.

DETAILED DESCRIPTION

Figure 1:
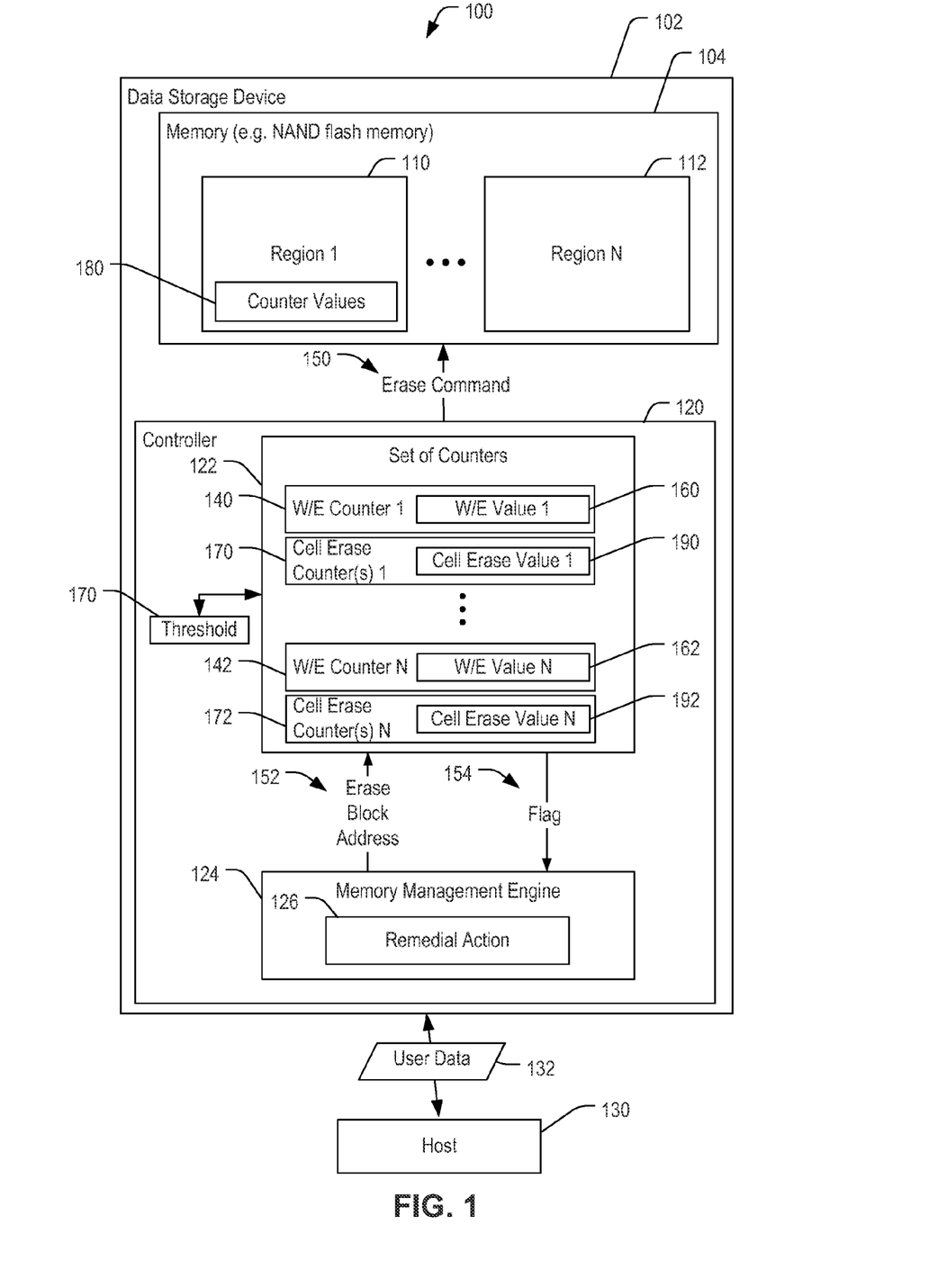
FIG. 1 is a block diagram of a particular illustrative embodiment of a system including a data storage device configured to track cell erases applied to storage elements and to initiate a remedial action.

Referring to FIG. 1, a particular embodiment of a system 100 includes a data storage device 102 coupled to a host device 130. The data storage device 102 is configured to track erase operations and to track cell erases of individual storage elements in multiple regions of a non-volatile memory 104 and to initiate a remedial action based on the tracked erase operations and cell erases.

The host device 130 may be configured to provide data, such as user data 132, to be stored at the non-volatile memory 104 or to request data to be read from the non-volatile memory 104. For example, the host device 130 may include a mobile telephone, a music or video player, a gaming console, an electronic book reader, a personal digital assistant (PDA), a computer, such as a laptop computer, a notebook computer, or a tablet, solid state storage drive, any other electronic device, or any combination thereof.

The data storage device 102 includes the non-volatile memory 104 coupled to a controller 120. The non-volatile memory 104 may be a flash memory, such as a NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The non-volatile memory 104 includes multiple groups of storage elements, such as word lines of a multi-level cell (MLC) flash memory that include multiple MLC flash cells. The non-volatile memory 104 may also include multiple blocks of storage elements, such as erase blocks of a flash memory that include multiple word lines in each erase block. The non-volatile memory 104 is logically partitioned into multiple regions including a first region (region 1) 110 and an Nth region (region N) 112, where N is an integer greater than one. For example, in some implementations the non-volatile memory 104 may be partitioned into two regions (i.e., N equals 3). In other implementations, the non-volatile memory 104 may be partitioned into more than two regions, including the first region 110, one or more other regions (not shown), and the Nth region 112 (i.e., N is greater than 3). Each region 110-112 can include one or more word lines, blocks, or other portions of the non-volatile memory 104. To illustrate, in an implementation where the non-volatile memory 104 includes multiple arrays, multiple planes, multiple dies, or any combination thereof, each region may include multiple word lines or blocks within a single array, plane, or die. As another example, a single region (e.g., the first region 110) may span multiple arrays, planes, or dies, or any combination thereof. To illustrate, the first region 110 may include storage elements within a first die and storage elements within a second die.

The controller 120 is configured to receive data and instructions from and to send data to the host device 130 while the data storage device 102 is operatively coupled to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 may include an ECC engine (not shown) that is configured to receive data to be stored to the non-volatile memory 104 and to generate a codeword. For example, the ECC engine may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode data according to one or more other ECC encoding schemes, or any combination thereof. The ECC engine may include a decoder configured to decode data read from the non-volatile memory 104 to detect and correct, up to an error correction capability of the ECC scheme, bit errors that may be present in the data.

The controller 120 includes a set of counters 122 that are configured to track erase operations performed to the regions 110-112 of the non-volatile memory 104 and to track cell erases performed to the regions 110-112. The set of counters 122 includes multiple counters, including a first write/erase (W/E) counter (W/E counter 1) 140 and an Nth W/E counter (W/E counter N) 142. The first W/E counter 140 has a first W/E value 160 that is updatable by the controller 120 to track memory accesses to the first region 110. The Nth W/E counter 142 has an Nth W/E value 162 that is also updatable by the controller 120 to track memory accesses to the Nth region 112. The set of counters 122 also includes a first cell erase counter 170 and an Nth cell erase counter 172.

The first cell erase counter 170 has a first cell erase counter value 190 that is updatable by the controller 120 to track cell erases applied to one or more particular storage elements in the first region 110. For example, the first cell erase counter 170 may include multiple counters with each counter tracking cell erases to a corresponding storage element in the first region 110. The Nth cell erase counter 172 has an Nth cell erase value 192 that is also updatable by the controller 120 to track cell erases applied to one or more storage elements in the Nth region 112. For example, the Nth cell erase counter 172 may include multiple counters with each counter tracking cell erases to a corresponding storage element in the Nth region 112. An example of selecting and operating cell erase counters is described in further detail with respect to FIG. 2.

In an implementation where the non-volatile memory 104 is partitioned into two regions (i.e., N=2), the set of counters 122 may include two W/E counters (i.e., the W/E counters 140 and 142) and two cell erase counters (i.e., the cell erase counters 170 and 172). In implementations where the non-volatile memory 104 is partitioned into more than two regions (i.e., N>2), the set of counters 122 may include more than two W/E counters (i.e., the first W/E counter 140, one or more additional W/E counters (not shown), and the Nth W/E counter 142) and more than two cell erase counters (i.e., the first cell erase counter 170, one or more additional cell erase counters (not shown), and the Nth cell erase counter 172). The counters of the set of counters 122 may be implemented as data values stored in a random access memory (RAM) that is accessible to the firmware executing controller 120, as an illustrative example.

The controller 120 includes a memory management engine 124. The memory management engine 124 is configured to schedule erase operations of erase blocks that may be identified by an erase block address 152. For example, the erase block address 152 may correspond to a physical address (e.g., an index or other identifier) of an erase block in the non-volatile memory 104. To illustrate, the memory management engine 124 may perform a "garbage collection" operation in which valid data on an erase block is copied to another block, the erase block is erased, and the erased block is added to a list of available blocks to receive new data. The memory management engine 124 is configured to generate an erase command 150 to perform an erase operation at the erase block address 152 of the non-volatile memory 104. In addition, the memory management engine 124 is configured to provide the erase block address 152 to the set of erase counters 122.

In response to determining the erase block address 152 corresponding to a physical address of a block to be erased, the controller 120 may select a particular W/E counter of the set of counters 122 corresponding to a region of the non-volatile memory 104 that is tracked by the particular W/E counter. For example, when the erase block address 152 corresponds to the first region 110, the controller 120 may determine that the first W/E counter 140 maintains a count of erase operations to the first region 110, and as a result the first W/E value 160 may be updated by the first W/E counter 140. As another example, when the erase block address 152 corresponds to a block in the Nth region 112, which is tracked by the Nth W/E counter 142, the Nth W/E value 162 of the Nth W/E counter 142 may be updated to indicate the erase operation.

The controller 120 may be configured to update a value of a corresponding cell erase counter 170-172 based on data that is stored to individual storage elements that are tracked by the cell erase counters 170-172. For example, when a storage element is programmed (or scheduled to be programmed) from an erase state to a non-erased state, a cell erase counter corresponding to the storage element may be incremented. To illustrate, in a single level cell (SLC) implementation, each storage element may remain in an erased state that represents a "1" value or may be set to a programmed state that represents a "0" value. Upon sending data to be programmed to a word line in first region 110, the controller 120 may increment the first cell erase value 190 in response to determining that a storage element that is tracked by the first cell erase counter 170 and is to receive a "0" value of the data. Alternatively, the controller 120 may store an indication that the first cell erase value 190 is to updated and may increment the first cell erase value 190 in response to the storage element being erased (rather than in response to the storage element being written).

In a multi-level cell (MLC) implementation, each storage element may remain in an erased state that represents an all-1's value, such as a "11" value in a two bit-per-cell (BPC) implementation or a "111" value in a three BPC implementation. The controller 120 may increment the first cell erase value 190 in response to determining that a storage element that is tracked by the first cell erase counter 170 and is to store a multi-bit value that corresponds to one or more designated states. To illustrate, in a 2-BPC implementation the values "11", "01", "00", "10" may correspond to an amount of charge injected onto a floating gate of a storage device. The value "11" may correspond to a least amount of charge on the floating gate (i.e., an erased state) and each of the values "01", "00", and "10" may correspond to an incrementally increased amount of charge on the floating gate. The controller 120 may be configured to increment the first cell erase value 190 when the tracked storage element is to be programmed to store "00" or "10" but to not increment the first cell erase value 190 when the tracked storage element is to be programmed to store "01" or to remain in the erased state. Alternatively, the controller 120 may be configured to increment the first cell erase value 190 when the tracked storage element is to store any non-erase value (e.g., "01", "00" or "10"). As another example, the controller 120 may be configured to increment the first cell erase value 190 only when the tracked storage element is to store a value corresponding to the highest-charge state (e.g., "10").

As an alternative, or in addition, to tracking data to be written to storage elements the first region 110 to update values of the first cell erase counter 170, the controller 120 may track data that is read from the first region 110 to determine values that are stored in the storage element(s) tracked by first cell erase counter 170. For example, after data is read from a word line of the non-volatile memory 104 and decoded by an ECC decoder, the decoded data may be accessible by the controller 120 to determine bit values stored in each tracked storage element in the word line.

Each of the values 160-162 that correspond to counts of erase operations to the particular regions tracked by the corresponding counters 140-142 may be compared to a threshold 168. In response to determining that one or more of the values 160-162 satisfies the threshold 168, a flag 154 may be generated and provided to the memory management engine 124. In some embodiments, such as when the W/E counters 140-142 count up from an initial value, a value satisfies the threshold 168 when the value exceeds the threshold 168. In other embodiments, a value satisfies the threshold 168 when the value is greater than or equal to the threshold 168. Alternatively, in some embodiments, such as when the W/E counters 140-142 count down from an initial value, a value satisfies the threshold 168 when the value is less than the threshold 168. In other embodiments, a value satisfies the threshold 168 when the value is less than or equal to the threshold 168. The memory management engine 124 may receive the flag 154 and based on the count of cell erases for the corresponding region, may select and initiate a remedial action 126 to the corresponding region of the non-volatile memory 104.

For example, when the first W/E value 160 indicates that a count of erase operations to the first region 110 satisfies the threshold 168, the controller 120 may be configured to initiate the remedial action 126 to the first region 110. The remedial action 126 may be selected as a function of the first W/E value 160 and the first cell erase counter value 190. For example, blocks having the same number of W/E cycles may more reliably store data when a fewer number of word lines have a high cell erase count (e.g., a cell erase count satisfying a cell erase count threshold) as compared to when a greater number of word lines have a high erase count. An "effective" count of W/E cycles may be determined as a more accurate indication of block wear than may be provided by the W/E value 160. As an example, the effective count of W/E cycles may be based the first W/E value 160 and the first cell erase value 190. As another example, the effective count of W/E cycles may be based on the first W/E value 160 and a number of word lines in the corresponding region that have cell erase values that satisfy a threshold.

The remedial action 126 may include scheduling one or more erase blocks in the first region 110 to be unused after performing a data move operation that causes data in the one or more erase blocks to be moved to a different memory location of the non-volatile memory 104. As another example, the remedial action 126 may include flagging one or more erase blocks for enhanced reliability techniques. Enhanced reliability techniques may include using a more robust ECC scheme for data to be stored in the one or more erase blocks, such as by increasing a proportion of parity bits to data bits. As another example, the one or more erase blocks may be flagged for interleaving of data and parity across multiple logical pages of a word line. Because different logical pages of a word line may have different reliability, interleaving data and parity across multiple logical pages distributes errors from each logical page across multiple ECC codewords and reduces a probability that an uncorrectable number of errors will be introduced into any single ECC codeword. As another example, the one or more erase blocks may be flagged for dynamic reading that includes reading data by performing multiple sensing operations using multiple read voltages to identify a set of read voltages that corresponds to a fewest number of errors in the data. Potential corruption of data in the non-volatile memory 104 caused by W/E cycling effects may be anticipated based on such effective W/E cycle counts of erase operations to each of the regions 110-112. The remedial action 126 may be performed for one or more of the regions 110-112 to avoid unrecoverable corruption of data resulting from accumulated W/E cycling effects due to multiple cell erases.

In some implementations, the W/E counters 140-142 may count upward from a reset value (e.g., a 0 value) with each erase operation to the region tracked by the particular W/E counter 140-142. The W/E value 160-162 of each W/E counter 140-142 may be compared against the threshold 168 (e.g., each time the W/E value 160-162 is updated) to determine when a number of erase operations to a corresponding region 110-112 of the non-volatile memory 104 satisfies the threshold 168. However, in other implementations, other configurations of the W/E counters 140-142 may be applied. For example, the W/E counters 140-142 may be initially set to a value corresponding to a W/E cycle limit, and the W/E counters 140-142 may decrement the corresponding W/E value 160-162 with each erase operation. When one of the W/E values 160-162 reaches a zero value, the flag 154 may be provided to the memory management engine 124.

Figure 3:
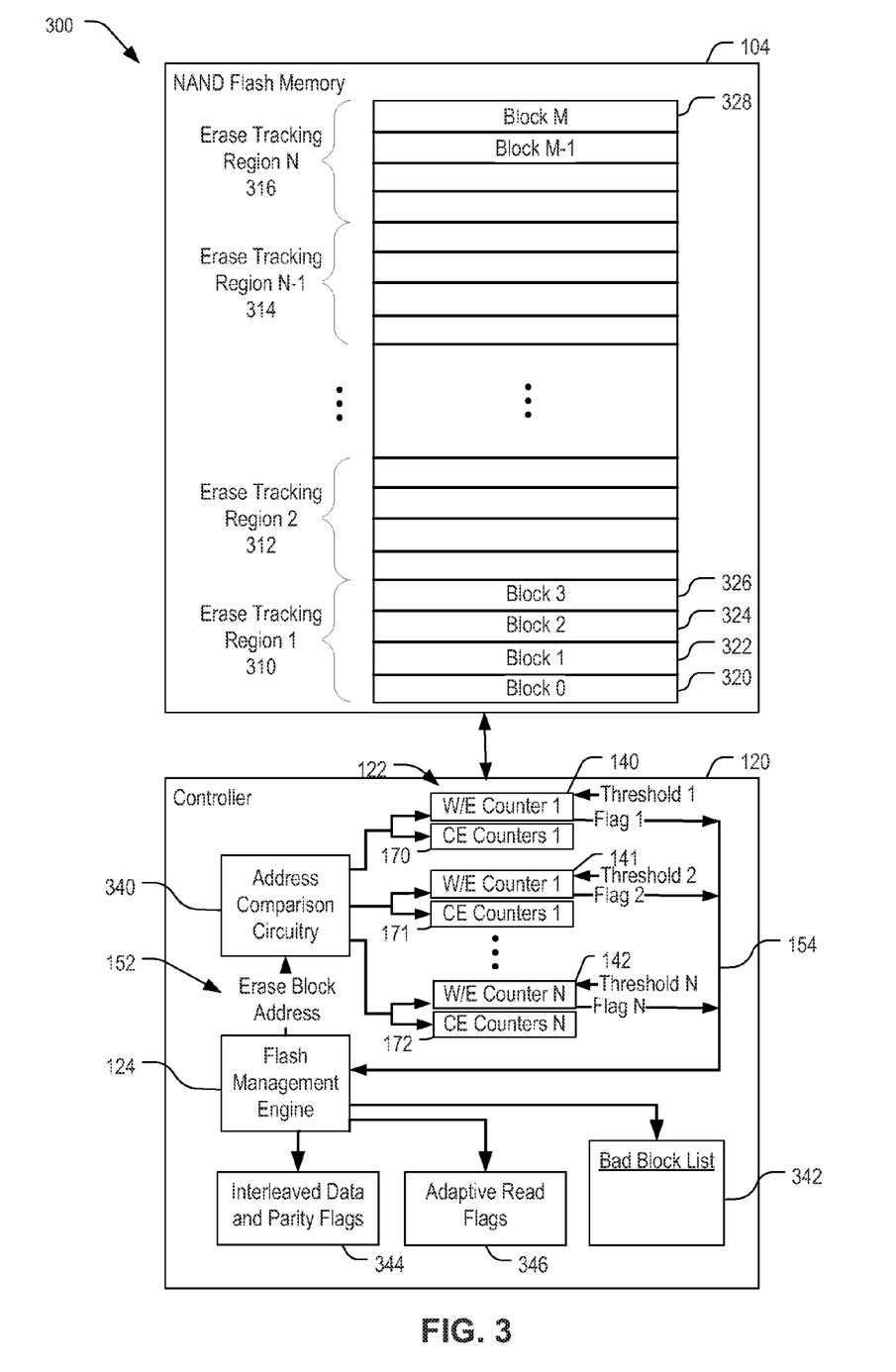
FIG. 3 is another block diagram illustrating a particular embodiment of components that may be incorporated in the data storage device of FIG. 1.

Because each region 110-112 may be determined according to W/E endurance characteristics, different thresholds may be used for different groups, as described with respect to FIG. 3. In other implementations, the single threshold 168 may be used for all of the regions 110-112 and an initial counter value of each of the groups may be adjusted according to characteristics of the groups. As a result, a group of erase blocks with higher W/E endurance may start with a lower initial counter value and may reach the threshold 168 after a greater number of W/E cycles than a group with lower W/E endurance that starts with a higher initial counter value.

The controller 120 may be configured to store counter values 180 to specific or dedicated portions of the non-volatile memory 104 for storage during power off conditions. For example, the controller 120 may be configured to store counter values 180 of the set of counters 122 to the non-volatile memory 104 during a session shutdown operation of the data storage device 102. The controller 120 may further be configured to retrieve the stored counter values 180 from the non-volatile memory 104 and to initialize the W/E counters 140-142 and the cell erase counters 170-172 of the set of counters 122 according to the stored counter values 180 during a session initialization operation of the data storage device 102. To illustrate, the counter values 180 may include a table or other data structure that indicates a number of the regions 110-112 (e.g., N regions). For each region, the counter values 190 may include values of a corresponding pair of counters (e.g., the first W/E value 160 and the first cell erase value 190 for the first region 110, an address range corresponding to the particular region (e.g., addresses of a first and last erase block within the first region 110), and a value of the threshold 168 corresponding to the particular region. For example, a number and arrangement of the regions 110-112 may be modified over the life of the data storage device 102. In addition, different regions may correspond to different thresholds.

During operation, the memory management engine 124 may identify an erase block to be erased and may provide the erase block address 152 to the set of erase counters 122. In addition, the controller 120 may issue the erase command 150 to the non-volatile memory 104, such as concurrently with providing the erase block address 152 to the set of erase counters 122.

The controller 120 may determine a particular counter of the set of counters 122 that tracks the region of the non-volatile memory 104 corresponding to the erase block address 152. For example, the erase block address 152 may correspond to an erase block in the first region 110, which may be tracked by the first W/E counter 140. In response to receiving the erase block address 152, a determination may be made that the erase block address 152 corresponds to the first W/E counter 140, and the first W/E counter 140 may update the first W/E value 160 to indicate an additional erase operation has been or is being performed within the first region 110. In addition, the first cell erase value 190 may be updated based on data values that are read from or written to a storage element tracked by the first cell erase counter 170.

In response to the first W/E value 160 (upon being updated by the first W/E counter 140) satisfying the threshold 168, a corresponding flag 154 may be provided to the memory management engine 124. In response to receiving the flag 154, the memory management engine 124 may retrieve the first cell erase value 190 and determine the remedial action 126 based on an effective count of W/E cycles to the first region 110. The memory management engine 124 may initiate the remedial action 126, such as scheduling one or more erase blocks to be unused or to be used in conjunction with one or more higher reliability techniques, such as described in further detail with respect to FIG. 3.

By tracking counts of erase operations to different regions of the non-volatile memory 104, and by selecting and initiating the remedial action 126 in response to a count of erase operations to a particular region 110-112 satisfying the threshold 168, in addition to a count of cell erases corresponding to the particular region 110-112, data loss due to cumulative effects of W/E cycling occurring in the particular region 110-112 may be more accurately predicted and remedied as compared to implementations that do not track cell erases. As a result, a number of errors occurring in the stored data due to W/E cycling may be maintained at a correctable level for longer periods and a useful life of the data storage device 102 may be extended. The set of counters 122 and corresponding logic to map the set of counters 122 to individual regions of the non-volatile memory 104 may be implemented in dedicated circuitry to reduce latency and processing impact on the controller 120 during the erase operation, as described in further detail with respect to FIG. 3. Alternatively, the set of erase counters 122 may be implemented via one or more software processes executed by a processor within the controller 120, or by a combination of software executed by a processor and dedicated circuitry.

Figure 2:
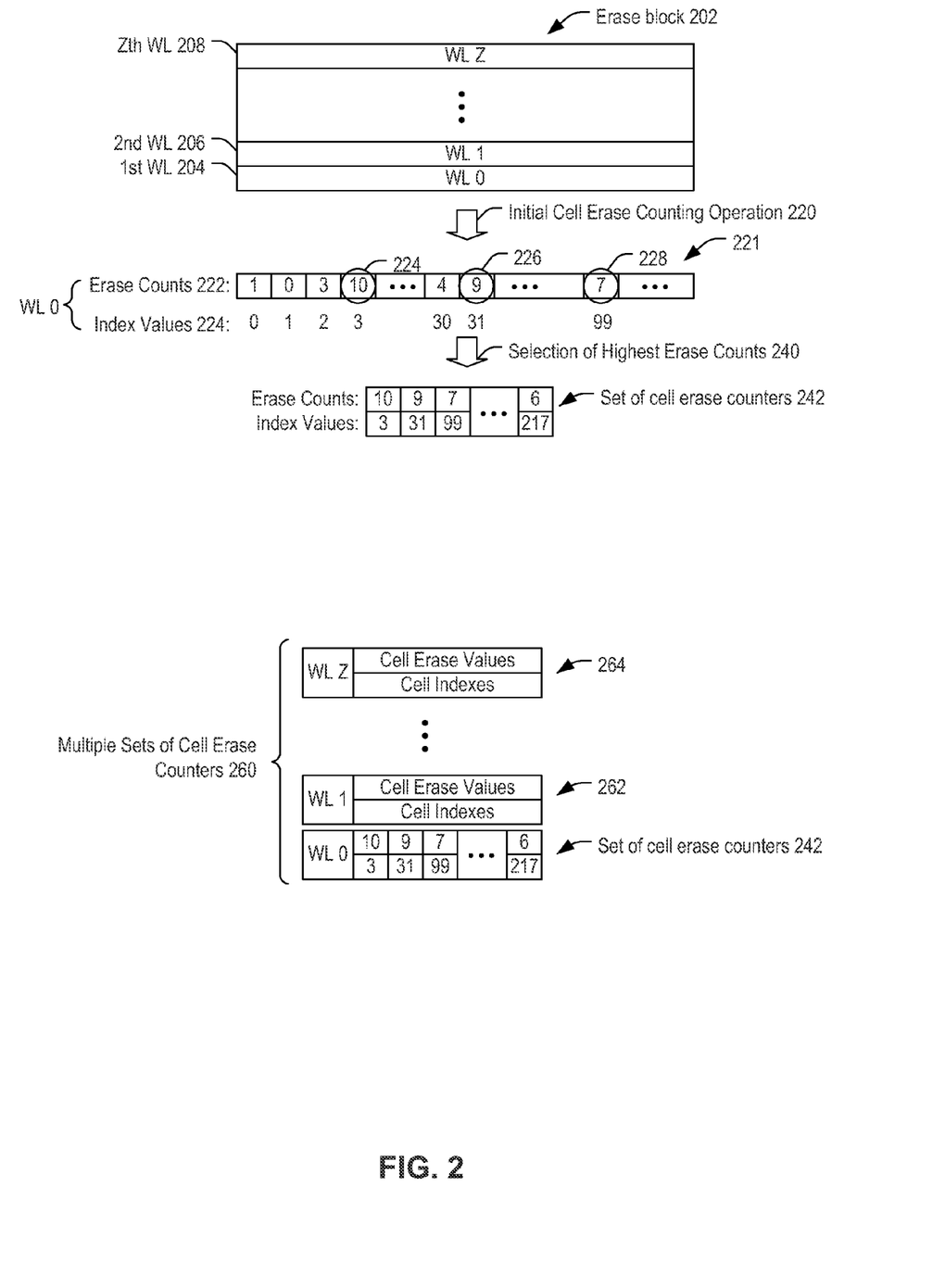
FIG. 2 is a block diagram illustrating a particular embodiment of components that may be incorporated in the data storage device of FIG. 1.

FIG. 2 illustrates components that may be implemented in the data storage device 102 of FIG. 1. An erase block 202 in the first region 110 of the non-volatile memory 104 may include multiple word lines, illustrated as a first word line 204, a second word line 206, up to a Zth word line 208. Each of the word lines 204-208 includes multiple storage elements, such as flash memory cells.

The controller 120 may initiate an initial cell erase counting operation 220 to determine cell erase counters corresponding to the erase block 202. For example, the controller 120 of FIG. 1 may determine, based on the W/E counter 140 of FIG. 1, that the erase block 202 may be subject to W/E cycling effects and the controller 120 may initiate cell erase counting for the erase block 202. The controller 120 may generate a set of erase counts 222 corresponding to a number of times a logical "0" value is written into each storage element of the first word line 204. To illustrate, the controller 120 may generate data 221 that includes, for each storage element of the first word line 204, an erase count 222 for the cell and a corresponding index value 224 for the cell. A first storage element on the first word line 204 may have an index value of 0 and, after a predetermined number of W/E cycles have been performed to the erase block 202, the first storage element may be identified as having a single erase count. For example, although the first storage element with index value 0 may have been accessed via multiple write operations to the first word line 204, in only a single one of the write operations is the value of the first storage element set from the erase state (e.g., a logical "1" value) to a non-erase state (e.g., a logical "0" value). Therefore, only a single one of the predetermined number of erase operations at the erase block 202 adjusts a state of the first storage element from the non-erase state to the erase state.

Each storage element may have a determined erase count 222. For example, a second storage element of the first word line 204 that has index value 1 is illustrated as having a 0 erase count. A third storage element that has index value 2 is illustrated as having an erase count of 2, and a fourth storage element having an index value 3 is illustrated as having an erase count of 10.

After the predetermined number of erase operations have been performed at the erase block 202 and the erase counts 222 have been generated, the controller 120 may be configured to initiate a selection of the highest erase counts 240. To illustrate, the controller 120 may determine a set of storage elements of the first word line 204 that have a high erase count, such as having an erase count higher than a threshold amount, or by selecting a particular number of storage elements having the highest counts of the erase counts 222. As illustrated, an entry 224 corresponds to the storage element with index 3 and has an erase count of 10, an entry 226 corresponds to a storage element with index 31 and an erase count of 9, and an entry 228 corresponds to a storage element with index 99 and an erase count of 7.

The controller 120 may be configured to generate a data structure resulting from the selection of the highest erase counts 240 to generate a set of cell erase counters 242. The set of cell erase counters 242 may include a cell erase value corresponding to selected index values of storage elements in the first word line 204 that have been identified as being written and erased with relatively high frequency as compared to other storage elements in the first word line 204. The controller 120 may maintain the set of cell erase counters 242 to track cell erase counts for multiple storage elements in the first word line 204 of the erase block 202, such as included in the cell erase counters 170 of FIG. 1 corresponding to the first region 110.

The controller 120 may be configured to select a remedial action based at least partially on a determination of how many of the cell erase counts exceed a threshold. To illustrate, when the write erase counter 140 increments the write erase value 160 to a value higher than the threshold 168, the controller 120 may access the set of cell erase counters 242 to identify how many of the cell erase counts exceed a cell erase threshold. In response to a relatively large number of word lines in the erase block 202 having a cell erase count that exceeds a cell erase threshold, the controller 120 may select scheduling the erase block 202 to be added to a bad block list, while in response to a relatively small number of word lines in the erase block 202 having a cell erase count that exceeds the cell erase threshold, the controller 120 may select an enhance reliability technique, such as an interleaved or adaptive read technique, as the remedial action 126.

The controller 120 may be configured to generate multiple sets of cell erase counters similar to the set of erase counters 242, such as a set of cell erase counters for each word line 204-206 of the erase block 202. For example, during the initial cell erase counting operation 220, the controller 120 may generate multiple sets of data that are similar to the data 221 and that identify, for each word line 204-208 in the erase block 202, index values and corresponding erase counts for storage elements in the word line. After completing the initial cell erase counting operation 220, the controller 120 may be configured to generate multiple sets of erase counters 260, illustrated as including the set of cell erase counters 242 corresponding to the first word line 204, a second set of cell erase counters 262 corresponding to the second word line 206, and additional sets of cell erase counters including a Zth set of cell erase counters 264 corresponding to word line Z 208.

The controller 120 may be configured to maintain the multiple sets of cell erase counters 260 to track cell erase counts for multiple storage elements in multiple word lines in the first region 110. The controller 120 may be configured to select a remedial action by determining a number of the word lines 204-208 that have cell erase counts that exceed a first threshold and may compare the number of word lines having cell erase counts exceeding the first threshold to a second threshold. For example, when an erase block 202 includes 512 word lines, and when the controller 120 determines that 10 or more of the 512 word lines have storage elements with erase counts exceeding an erase count threshold, the controller 120 may schedule the erase block 202 to be unused as the remedial action 126. Alternatively, if fewer than 10 word lines have erase counts corresponding to the erase count threshold, the controller 120 may select interleaving or adaptive reading as the remedial action 126, as further described with respect to FIG. 3.

Referring to FIG. 3, a particular embodiment of the data storage device 102 of FIG. 1 is illustrated and generally designated 300. The non-volatile memory 104 is illustrated as a NAND flash memory that includes multiple erase blocks, including block 0 320, block 1 322, block 3 324, block 3 326, and additional blocks up to an Mth block (block M) 328. The NAND flash memory 104 is logically partitioned into multiple erase tracking regions, illustrated as a first erase tracking region 310, a second erase tracking region 312, and additional regions up to an N−1st erase tracking region 314 and an Nth erase tracking region 316. The controller 120 includes the set of counters 122 including the first W/E counter 140 and the first cell erase (CE) counter 170, a second W/E counter 141 and a second cell erase counter 171, and one or more other counters including the Nth W/E counter 142 and the Nth cell erase counter 172. The controller 120 includes address comparison circuitry 340 that is coupled to receive the erase block address 152 from the flash management engine 124 and to generate signals to a pair of counters that track a region 310-316 of the NAND flash memory 104 corresponding to the erase block address 152. The controller 120 further includes one or more interleaved data and parity flags 344, one or more adaptive read flags 346, and a bad block list 342.

The controller 120 is configured to provide the erase block address 152 from the flash management engine 124 to the address comparison circuitry 340. The address comparison circuitry 340 may be programmable to route particular erase block addresses 152 to particular counters of the set of counters 122. For example, the address comparison circuitry 340 may determine whether the erase block address 152 is within a first address range corresponding to the first erase tracking region 310, a second address range corresponding to the second erase tracking region 312, etc., and may generate an output signal to a corresponding one of the W/E counters 140-142 to cause the W/E counter to update its counter value. In addition, the controller 120 is configured to generate a control signal to cause a corresponding one of the cell erase counters 170-172 to update its counter value based on determining a value that is stored into (or that is read from) a corresponding storage element.

Each of the W/E counters 140-142 may be responsive to a corresponding threshold, illustrated as threshold 1, threshold 2, . . . threshold N. For example, each W/E counter 140-142 may be configured to perform comparisons of the counter's value to its corresponding threshold and to generate a flag signal in response to the value satisfying the threshold. To illustrate, when the first W/E counter 140 updates its counter value to an amount that matches the first threshold (threshold 1), the first W/E counter 140 may generate a first flag indication (Flag 1) that may be provided to the flash management engine 124 as the flag 154. Each of the W/E counters 140-142 may have a programmable threshold value such that each of the thresholds may have a distinct value, or one or more (or all) of the W/E counters 140-142 may use a same threshold value.

Each of the W/E counters 140-142 may provide a distinct flag signal to the flash management engine 124. For example, the flag indicator 154 may be a multi-bit signal, such as an interrupt signal with each bit of the interrupt signal corresponding to a distinct counter of the set of counters 122. A value of the corresponding cell erase counter 170-172 may also be provided with the interrupt signal to the flash management engine 124. In this manner, the flash management engine 124 may determine a particular erase tracking region 310-216 that has a count of erase operations satisfying its corresponding threshold and may determine an effective count of W/E cycles based on the count of erase operations and the count of cell erases.

In response to a relatively high effective count of W/E cycles (e.g., when an effective count of W/E cycles is greater than or equal to a first threshold), the flash management engine 124 may select and perform the remedial action 126 of FIG. 1 by adding addresses of the blocks of the corresponding region, such as blocks 0-3 320-226 of the first erase tracking region 310, to the bad block list 342. The flash management engine 124 may be configured to perform data move operations to transfer data from blocks scheduled to be added to the bad block list 342, such as by copying the data to one or more spare blocks that may be available in the non-volatile memory 104. The flash management engine 124 may be configured to prevent usage of erase blocks that have been added to the bad block list 342.

In response to a relatively low effective count of W/E cycles (e.g., when the effective count of W/E cycles is less than or equal to a second threshold), the flash management engine 124 may be configured to set one or more of the interleaved data and parity flags 344 to indicate that one or more erase blocks store data according to an interleaved configuration. To illustrate, because reading a single logical page of a physical page requires fewer sense operations than reading all logical pages of the physical page, ECC codewords may be stored on individual logical pages to be readable using a reduced number of sense operations. However, different logical pages of a single physical page may have different reliability. As a result, as an erase block is subjected to a number of W/E cycles approaching its threshold, an ECC codeword stored on a less reliable logical page is more likely to encounter an uncorrectable number of errors than an ECC codeword stored on a more reliable logical page. By interleaving multiple ECC codewords across multiple logical pages, errors occurring on the less-reliable logical page as well as errors occurring on the more-reliable logical page are shared among multiple ECC codewords, reducing the probability that any of the ECC codewords encounters an uncorrectable number of errors. The interleaved data and parity flags 344 may include a flag for each region 310-216 or for each erase block 320-228 in the non-volatile memory 104, and a value of each flag may be set to indicate whether the associated region or block uses a page-by-page data and parity configuration or an interleaved data and parity configuration.

In response to an intermediate effective count of W/E cycles (e.g., when the effective count of W/E cycles is between the first threshold and the second threshold), the flash management engine 124 may be configured to set one or more of the adaptive read flags 346 to indicate that one or more erase blocks are to be read using an adaptive read technique instead of, or in addition to, using, interleaved configuration. To illustrate, a set of read voltages may correspond to boundaries between states of storage elements and may be used during sensing operations to determine a state of storage elements of a word line in an erase block. However, as W/E cycling increases, shifting of threshold voltages of storage elements may cause the boundaries between the states to shift from the read voltages. Adaptive read techniques may include performing multiple reads of an ECC codeword from an erase block and varying one or more of the read voltages. Data resulting from each read may be provided to an ECC decoder to identify a corresponding number of errors detected in the data to identify values of the read voltages that result in a reduced number of errors. A set of read voltages that is identified as resulting in reduced errors may be selected for reading the data, resulting in a more accurate representation of the data as compared to using default values of the read voltages.

A mapping of regions to counters and a logical partitioning of the non-volatile memory 104 into the regions 110-112 may be stored as an initial configuration of the data storage device 102 of FIG. 1 and may be set according to an initial set of programmable values, such as determined by a manufacturer of the data storage device 102. Although FIGS. 1 and 3 illustrate multiple regions having substantially equal size and that are substantially evenly distributed throughout the non-volatile memory 104, it should be understood that in other implementations one or more of the memory regions may have a size differing from others of the memory regions. As an example, effects of W/E cycling on stored data in the non-volatile memory 104 may be dependent on one or more factors such as a location in a memory array (e.g., at an edge of the array as compared to at an interior of the array), a particular plane of multi-plane memory, a particular die of a multi-die memory, one or more other factors such as a type of data stored, a ratio of '0' values to '1' values in stored data at the non-volatile memory 104, or other factors. Sizes of memory regions and groups of blocks in each region may be determined according to one or more such factors.

Because partitioning of the non-volatile memory 104 into multiple regions and a mapping of regions to counters may be programmable, the data storage device 102 may be configured to accommodate various factors and various differences in effects of W/E cycling on various portions of the non-volatile memory 104. For example, an initial logical partitioning and mapping of regions to the counters 140-142 and 170-172 may be set by a manufacturer of the data storage device 102 of FIG. 1. To illustrate, regions 110-112 of the non-volatile memory 104 may be set based on results of testing portions of the non-volatile memory 104 for susceptibility to W/E cycling effects, based on types of data stored to regions of the non-volatile memory 104, such as file management data or pre-loaded content, based on one or more other criteria, or any combination thereof. The memory management engine 124 may be configured to update the logical partitioning of the non-volatile memory 104 and a corresponding mapping of regions to counters according to one or more criteria, such as according to a history of erase operations to different portions of the non-volatile memory 104.

Figure 4:
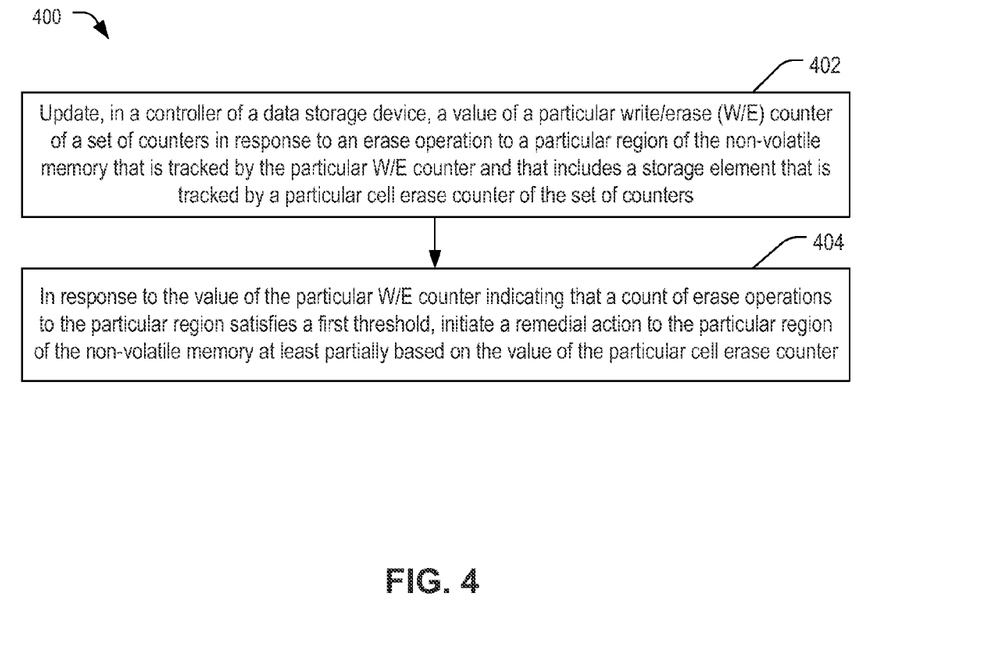
FIG. 4 is a flow chart of a particular illustrative embodiment of a method of tracking cell erases applied to storage elements of a non-volatile memory.

Referring to FIG. 4, a particular embodiment of a method 400 is depicted. The method 400 may be performed in a data storage device that includes a controller and a non-volatile memory, such as a flash memory. For example, the method 400 may be performed by the data storage device 102 of FIG. 1.

The method includes updating, in a controller of the data storage device, a value of a particular write/erase (W/E) counter of a set of counters in response to an erase operation to a particular region of the non-volatile memory that is tracked by the particular W/E counter and a particular cell erase counter of the set of counters, at 402. For example, erase operations to a first region of the non-volatile memory may be tracked by a first W/E counter and a first cell erase counter of the set of counters and erase operations to a second region of the non-volatile memory may be tracked by a second W/E counter and a second cell erase counter of the set of counters. For example, erase operations to the first region 110 of FIG. 1 may be tracked by the first W/E counter 140 and the first cell erase counter 170 and erase operations to the Nth region 112 of FIG. 1 may be tracked by the Nth W/E counter 142 and the Nth cell erase counter 172.

For example, in response to a write operation, the value of the particular cell erase counter may be updated in response to the storage element being set from an erase state to a non-erase state and may be not updated in response to the storage element remaining in the erase state. The controller may maintain a set of cell erase counters to track cell erase counts for multiple storage elements in a word line in the particular region, and the remedial action may be selected based at least partially on a number of the cell erase counts that exceed a first threshold. As another example, the controller may maintain multiple sets of cell erase counters to track cell erase counts for multiple storage elements in multiple word lines in the particular region. The controller may be configured to select the remedial action by determining a number of the word lines having cell erase counts that exceed a first threshold and comparing the number to a second threshold.

In response to the value of the particular W/E counter indicating that a count of erase operations to the particular region satisfies a first threshold, a remedial action to the particular region of the non-volatile memory is initiated at least partially based on the value of the particular cell erase counter, at 404. For example, the remedial action may be the remedial action 126 initiated by the memory management engine 124 of FIG. 1 and may include scheduling one or more erase blocks for non-use, flagging one or more erase blocks for data and parity interleaving, and/or flagging one or more erase blocks for adaptive reading.

The method 400 may also include, during a session shutdown operation of the data storage device, storing values of the set of counters to the non-volatile memory. During a session initialization operation of the data storage device, stored counter values may be retrieved from the non-volatile memory and counters of the set of counters may be initialized according to the stored counter values. For example, the controller 120 may store the counter values 180 of FIG. 1 to the non-volatile memory 104 prior to powering down and may retrieve the counter values 180 from the non-volatile memory 104 during an initialization/powering up event.

Initiating the remedial action may include scheduling an erase block associated with the particular W/E counter to be unused, such as by scheduling the erase block to be added to the bad block list 342 of FIG. 3 after copying data from the erase block to another block of the non-volatile memory 104. Alternatively or in addition, initiating the remedial action may include setting a flag (e.g., the interleaved data and parity flags 344 of FIG. 3) to indicate data and parity interleaving is to be applied to the particular region. Alternatively or in addition, initiating the remedial action may include setting a flag (e.g., the adaptive read flags 346 of FIG. 3) to indicate adaptive reading is to be applied to the particular region.

The first region may correspond to a first set of erase blocks of the non-volatile memory and the second region may correspond to a second set of erase blocks of the non-volatile memory. As one example, the first set of erase blocks may include a single erase block and the second set of erase blocks may include another single erase block. As a second example, the first set of erase blocks may include a contiguous group of erase blocks, such as the first erase tracking region 310 of FIG. 3 that includes a contiguous group of four erase blocks 320-326. As a third example, the first set of erase blocks may include a non-contiguous group of erase blocks. To illustrate, the first set of erase blocks may include blocks that have similar physical characteristics but that may not be adjacent to each other, such as block 0 320 and block M 328 of FIG. 3 that have common physical characteristics due to being at edges of the NAND flash memory 104. The non-volatile memory may be logically partitioned into a programmable number of regions and a count of erase operations to each of the multiple regions may tracked by a respective counter of the set of counters.

Although various components depicted herein are illustrated as block components and described in general terms, such components may include one or more microprocessors, state machines, or other circuits configured to enable the controller 120 of FIG. 1 to select and initiate the remedial action based on comparisons of the W/E counter values 160-162 to one or more threshold(s) 170 and further based on cell erase counter values. For example, the controller 120 may represent physical components, such as hardware controllers, state machines, logic circuits, or other structures, to enable the controller 120 of FIG. 1 to track erase operations to individual regions 110-112 and to select and initiate one or more remedial actions to individual regions 110-112.

The controller 120 may be implemented using a microprocessor or microcontroller programmed to update counters in response to erase operations to corresponding regions of the non-volatile memory 104, and upon determining that a counter value indicates that a number of erase operations to a particular region satisfies a threshold amount, to select a remedial action at least partially based on corresponding cell erase count, such as by scheduling one or more erase blocks for non-use or setting one or more of the interleaved data and parity flags 344 and/or the adaptive read flags 346. In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a controller and a non-volatile memory, performing:
   in response to an erase operation to a particular region of the non-volatile memory:
   updating, in the controller, a value of a particular cell erase counter of a plurality of cell erase counters, wherein each cell erase counter of the plurality of cell erase counters is associated with a storage element in the particular region; and
   updating, in the controller, a value of a write/erase (W/E) counter wherein the W/E counter is associated with the particular region; and
   in response to the value of the W/E counter satisfying a first threshold, initiating a remedial action to the particular region of the non-volatile memory at least partially based on the value of the particular cell erase counter.

2. The method of claim 1, wherein erase operations to a first region of the non-volatile memory are tracked by a first W/E counter, wherein a first cell erase count of a first storage element in the first region is tracked by a first cell erase counter, and wherein the first region corresponds to a first set of erase blocks of the non-volatile memory, and wherein erase operations to a second region of the non-volatile memory are tracked by a second W/E counter, wherein a second cell erase count of a second storage element in the second region is tracked by a second cell erase counter, and wherein the second region corresponds to a second set of erase blocks of the non-volatile memory.

3. The method of claim 2, wherein the first set of erase blocks comprises a single erase block and wherein the second set of erase blocks comprises another single erase block.

4. The method of claim 1, wherein in response to a write operation, the value of the particular cell erase counter is updated in response to the storage element being set from an erase state to a non-erase state and is not updated in response to the storage element remaining in the erase state.

5. The method of claim 1, wherein the controller maintains a set of cell erase counters to track cell erase counts for multiple storage elements in a word line in the particular region, and wherein the remedial action is selected based at least partially on a number of the cell erase counts that exceed a first cell erase threshold.

6. The method of claim 1, wherein the controller maintains multiple sets of cell erase counters to track cell erase counts for multiple storage elements in multiple word lines in the particular region, and wherein the controller is configured to select the remedial action by determining a number of the word lines having cell erase counts that exceed a first cell erase threshold and comparing the number to a second threshold.

7. The method of claim 1, wherein initiating the remedial action includes scheduling an erase block in the particular region to be unused.

8. The method of claim 1, wherein initiating the remedial action includes setting a flag to indicate data and parity interleaving is to be applied to the particular region.

9. The method of claim 1, wherein initiating the remedial action includes setting a flag to indicate adaptive reading is to be applied to the particular region.

10. The method of claim 1, further comprising:
    during a session shut-down operation of the data storage device, storing cell erase values of the plurality of cell erase counters and a W/E value of the W/E counter for the particular region to the non-volatile memory; and
    during a session initialization operation of the data storage device, retrieving the stored cell erase values and the W/E value from the non-volatile memory and initializing counters according to the stored values.

11. The method of claim 1, wherein the non-volatile memory includes a flash memory.

12. A data storage device comprising:
    a non-volatile memory; and
    a controller including a set of write/erase (W/E) counters and a set of cell erase counters, wherein the controller is configured to update a value of a particular write/erase (W/E) counter in response to an erase operation to a particular region of the non-volatile memory that is tracked by the particular W/E counter and update a value of a particular cell erase counter of a plurality of cell erase counters, wherein each cell erase counter of the plurality of cell erase counters is associated with a storage element in the particular region, and
    wherein, in response to the value of the particular W/E counter indicating that a count of erase operations to the particular region satisfies a first threshold, the controller is configured to initiate a remedial action to the particular region of the non-volatile memory at least partially based on the value of the particular cell erase counter.

13. The data storage device of claim 12, wherein erase operations to a first region of the non-volatile memory are tracked by a first W/E counter, wherein a first cell erase count of a first storage element in the first region is tracked by a first cell erase counter, and wherein the first region corresponds to a first set of erase blocks of the non-volatile memory, and wherein erase operations to a second region of the non-volatile memory are tracked by a second W/E counter, wherein a second cell erase count of a second storage element in the second region is tracked by a second cell erase counter, and wherein the second region corresponds to a second set of erase blocks of the non-volatile memory.

14. The data storage device of claim 13, wherein the first set of erase blocks comprises a single erase block and wherein the second set of erase blocks comprises another single erase block.

15. The data storage device of claim 12, wherein in response to a write operation, the controller is configured to update the value of the particular cell erase counter in response to the storage element being set from an erase state to a non-erase state and to not update the value in response to the storage element remaining in the erase state.

16. The data storage device of claim 12, wherein the controller is configured to maintain a set of cell erase counters to track cell erase counts for multiple storage elements in a word line in the particular region, and wherein the controller is configured to select the remedial action based at least partially on a number of the cell erase counts that exceed a first cell erase threshold.

17. The data storage device of claim 12, wherein the controller is configured to maintain multiple sets of cell erase counters to track cell erase counts for multiple storage elements in multiple word lines in the particular region, and wherein the controller is configured to select the remedial action by determining a number of the word lines having cell erase counts that exceed a first cell erase threshold and comparing the number to a second threshold.

18. The data storage device of claim 12, wherein the controller is configured to initiate the remedial action by scheduling an erase block in the particular region to be unused.

19. The data storage device of claim 12, wherein the controller is configured to initiate the remedial action by setting a flag to indicate data and parity interleaving is to be applied to the particular region.

20. The data storage device of claim 12, wherein the controller is configured to initiate the remedial action by setting a flag to indicate adaptive reading is to be applied to the particular region.

21. The data storage device of claim 12, wherein the controller is configured to store values of the set of W/E counters and of the set of cell erase counters to the non-volatile memory during a session shut-down operation and to retrieve the stored values from the non-volatile memory and initialize the set of W/E counters of the set of cell erase counters according to the stored values during a session initialization operation.

22. The data storage device of claim 12, wherein the non-volatile memory includes a flash memory.

\* \* \* \* \*